US006696757B2

(12) United States Patent
Yunus et al.

(10) Patent No.: US 6,696,757 B2
(45) Date of Patent: Feb. 24, 2004

(54) CONTACT STRUCTURE FOR RELIABLE METALLIC INTERCONNECTION

(75) Inventors: Mohammad Yunus, Dallas, TX (US); Anthony L. Coyle, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 24 days.

(21) Appl. No.: 10/178,138

(22) Filed: Jun. 24, 2002

(65) Prior Publication Data

US 2003/0234447 A1 Dec. 25, 2003

(51) Int. Cl.[7] .............................................. H01L 23/48
(52) U.S. Cl. ...................... 257/735; 257/696; 257/738; 257/758; 257/778; 257/784
(58) Field of Search ................................ 257/735, 778, 257/738, 758, 696, 784; 438/106, 108

(56) References Cited

U.S. PATENT DOCUMENTS

| 5,801,446 A | 9/1998 | DiStefano et al. |
| 6,213,347 B1 | 4/2001 | Thomas |
| 6,228,680 B1 | 5/2001 | Thomas |
| 6,245,583 B1 | 6/2001 | Amador et al. |

OTHER PUBLICATIONS

"A Silicon and Aluminum Dynamics Memory Technology", Richard A. Larsen, IBM J. Res. Develop., vol. 24, No. 3, May 1980, pp. 268–282.
"Calculated Thermally Induced Stresses in Adhesively Bonded And Soldered Assemblies", E. Suhir, ISHM Int. Symp. Michroel., Oct. 1986, pp. 383–392.
"Controlled Collapse Reflow Chip Joining", L.F. Miller, IBM J. Res. Develop. 13, May 1969, pp. 239–250.
"Die Attachment Desion and Its Influence on Thermal Stresses in the Die and the Attachment", E. Suhir, IEEE, 1987, pp. 508–517.
"Geometric Optimization of Controlled Collapse Interconnections", L.S. Goldman, IBM J. Res. Develop. 13, May 1969, pp. 251–265.
"Parametric Study of Temperature Profiles in Chips Joined by Controlled Collapse Techniques", Sevgin Oktay, IBM J. Res. Develop. 13, May 1969, pp. 272–285.
"Reliability of Controlled Collapse Interconnections", K. C. Norris and A. H. Landzberg, IBM J. Res. Dev. 13, May 1969, pp. 266–271.
"SLT Device Metallurgy and Its Monolithic Extension" P.A. Totta and R.P. Sopher, IBM J. Res. Develop. 13, pp. 226–238.
"Studies of the SLT Chip Terminal Metallurgy", B.S. Berry and I. Ames, IBM J. Res. Develop. 13, May 1969, pp. 286–296.

(List continued on next page.)

Primary Examiner—Michael S. Lebentritt
Assistant Examiner—Doug Menz
(74) Attorney, Agent, or Firm—Wade James Brady, III; Frederick J. Telecky, Jr.

(57) ABSTRACT

A metallurgical interconnection for electronic devices is described, wherein the interconnection has first and second interconnection metals. The first metal is shaped to enlarge the contact area, thus providing maximum mechanical interconnection strength, and to stop nascent cracks, which propagate in the interconnection. Preferred shapes include castellation and corrugation. The castellation may include metal protrusions, which create wall-like obstacles in the interconnection zones of highest thermomechanical stress, whereby propagating cracks are stopped. The surface of the first metal has an affinity to form metallurgical contacts. The second metal is capable of reflowing. The first metal is preferably copper, and the second metal tin or a tin alloy.

14 Claims, 4 Drawing Sheets

OTHER PUBLICATIONS

"The Quality of Die–Attachment and Its Relationship to Stresses and Vertical Die–Cracking", C.G.M. VanKessel, S. A. gee and J.J. Murphy, IEEE 1983, pp. 237–244.

"Clasp Ceramic Column Grid Array Technology for Flip Chip Carriers", S. Ray, M. Interrante, L. Achard(8), M. Cole, I. DeSousa(*), L. Jimarez, G. Martin, and C. Reynolds,, IBM Microelectronics Division, Advanced Packaging Technologies Tutorial, Semi 1999, pp. A–1–A–7.

CONTACT STRUCTURE FOR RELIABLE METALLIC INTERCONNECTION

FIELD OF THE INVENTION

The present invention is related in general to the field of semiconductor devices and processes and more specifically to the structure of metallurgical interconnection pads for flip-chip assembly of semiconductor chips.

DESCRIPTION OF THE RELATED ART

The structure of contact pad metallizations and solder bumps for connecting integrated circuit (IC) chips to semiconductor packages or outside parts, as well as the thermomechanical stresses and reliability risks involved, have been described in a series of detailed publications by the International Business Machines Corporation in 1969 (IBM J. Res. Develop., Vol. 13, pp. 226–296): P. A. Totta et al., SLT Device Metallurgy and its Monolithic Extension, L. F. Miller, Controlled Collapse Reflow Chip Joining, L. S. Goldmann, Geometric Optimization of Controlled Collapse Interconnections, K. C. Norris et al., Reliability of Controlled Collapse Interconnections, S. Oktay, Parametric Study of Temperature Profiles in Chips Joined by Controlled Collapse Techniques, B. S. Berry et al., Studies of the SLT Chip Terminal Metallurgy.

During and after assembly of the IC chip to an outside part such as a substrate or circuit board by solder reflow, and then during device operation, significant temperature differences and temperature cycles appear between semiconductor chip 100 and the substrate. The reliability of the solder joint is strongly influenced by the coefficients of thermal expansion of the semiconductor material and the substrate material. For example, there is more than one order of magnitude difference between the coefficients of thermal expansion of silicon and FR-4. This difference causes thermomechanical stresses, which the solder joints have to absorb. Detailed calculations, in the literature cited above and in other publications of the early 1980's, involving the optimum height and volume of the solder connection and the expected onset of fatigue and cracking proposed a number of solder design solutions.

The fabrication methods and reliability problems involving flip-chips re-appear in somewhat modified form for ball-grid array packages. In their book "Chip Scale Package" (McGraw-Hill, 1999), John H. Lau and Shi-Wei Ricky Lee describe various semiconductor devices and packages of contemporary "chip-scale" families, as they are fabricated by a number of semiconductor companies worldwide. The newest designs and concepts in microelectronics assembly and packaging are aiming for a package with a planar area not substantially greater than the silicon chip itself, or at most 20% larger area. This concept, known as Chip-Scale Package (CSP), is finding particular favor with those electronics industries where the product size is continually shrinking such as cellular communications, pagers, hard disk drivers, laptop computers and medical instrumentation. Most CSP approaches are based on flip-chip assembly with solder bumps or solder balls on the exterior of the package, to interface with system or wiring boards.

The chip-to-be-flipped may be attached to a second interconnection surface such as an interposer, or alternatively, coupled directly to a printed circuit board (PCB). Attaching the flip-chip to the next interconnect is carried out by aligning the solder bumps or balls on the chip to contact pads on the second level interconnection and then performing a second solder reflow operation. During the reflow, the bumps or balls liquefy and make a bond to the next interconnect level which has pads or traces to receive the solder. Following the solder reflow step, flip-chips often use a polymeric underfill between the chip and the interposer or PCB to alleviate mechanical stress caused by the mismatch in the coefficients of thermal expansion (CTE) between the semiconductor chip, the interposer, if any, and the PCB. Many reliability problems occur due to the stress placed on the solder bumps or balls when the integrated circuit is cycled from hot to cool during operation. When another set of solder balls on the opposite side of the interposer is employed to complete the bonding process to a PCB, this second set may also be affected by similar stress and reliability problems.

One method aims at absorbing part of the thermomechanical stress on the solder joints by plastic material surrounding the joints and filling the gap between chip and substrate. See for instance, U.S. Pat. No. 6,228,680, issued on May 8, 2001; U.S. Pat. No. 6,213,347, issued on Apr. 10, 2001, and U.S. Pat. No. 6,245,583, issued on Jun. 12, 2001 (Thomas et al., Low Stress Method and Apparatus for Underfilling Flip-Chip Electronic Devices). However, the underfilling method represents an unwelcome process step after device attachment to the motherboard.

Another method applies a polymer layer on top of the protective overcoat with the aim of reducing the stress to the overcoat perimeter and the dielectric material underlying the contact pad. See for instance the publication "A Silicon and Aluminum Dynamic Memory Technology" by Richard A. Larsen (IBM J. Res. Develop., vol.24, May 1980, pp. 268–282). The article includes description of a flip-chip packaging technology using a solder bump on an under-bump metallization, which is resting its perimeter on a thick polyimide layer. The bump structure is often supported by another polyimide layer.

An urgent need has arisen for a coherent, low-cost method of fabricating flip-chip assembly of semiconductor devices offering a fundamental metallurgical solution of solder-to-metal interconnection and thermomechanical stress reliability. The method should be flexible enough to be applied for different semiconductor product families and a wide spectrum of design and process variations. Preferably, these innovations should be accomplished using the installed equipment base so that no investment in new manufacturing machines is needed.

SUMMARY OF THE INVENTION

A metallurgical interconnection for electronic devices is described, wherein the interconnection has first and second interconnection metals. The first metal is shaped to enlarge the contact area, thus providing maximum mechanical interconnection strength, and to stop nascent cracks, which propagate in the interconnection. Preferred shapes include castellation and corrugation. The castellation may include metal protrusions, which create wall-like obstacles in the interconnection zones of highest thermomechanical stress, whereby propagating cracks are stopped. The surface of the first metal has an affinity to form metallurgical contacts. The second metal is capable of reflowing. The first metal is preferably copper, and the second metal tin or a tin alloy.

The present invention is related to chip-scale packages, especially those fabricated with plastic multi-level substrates having a plurality of contact pads for solder "ball" board attach. Copper is the preferred metal used in constructing these substrates.

The present invention is further related to high density and high speed ICs with copper interconnecting metallization, especially those having high numbers of metallized inputs/outputs for flip-chip assembly. These circuits can be found in many device families such as processors, digital and analog devices, logic devices, high frequency and high power devices, and in both large and small area chip categories.

It is an aspect of the present invention to drastically reduce the number of solder joint failures in semiconductor packages and flip-chip devices by changing the failure mechanism from a probabilistic weakest-link mode to a parallel-type mode. In known technology, solder joint cracks, initiated by thermomechanical stress and implied with enough energy, are able to migrate until they find the weakest link in the joint and delaminate the joint. The failure mechanism is, therefore, controlled by the probability that a nascent crack will find the weakest link.

According to the Griffith energy-balance concept for crack formation in brittle solids (first published in 1920), a change in the length of a nascent crack or notch cannot change the sum of all energies; in other words, the sum of surface energy and mechanical energy has to stay constant. This means for a crack extension that the surface energy may generally increase, but the mechanical energy has to decrease. The mechanical energy itself consists of the sum of the strain potential energy stored in the material and the potential energy of the outer applied loading system. This says, whenever any of these energies can assume a lower value, the freed energy can be invested in generating more surface for an expanding crack.

Applying the Griffith equilibrium requirement to solder joints in semiconductor devices, whenever uniform thermomechanical stress is applied (for instance during operation or testing of the semiconductor device) so that it is larger than the failure stress, a nascent crack may propagate spontaneously and without limit—unless it is stopped or arrested. The failure stress at the crack front, in turn, is proportional to the free surface energy per unit area and to Young's modulus (a material constant), and inverse proportional to the length of the starter crack or notch.

Based on the invention, the fabrication of the castellated or corrugated metal (copper) structure transforms the solder volumes into reinforced composites with considerable toughness against fracture and propagation of nascent cracks. The main contribution to this toughness comes from the intrinsic adhesion energies of the components. The toughening is attributable to shielding processes, notably bridging, where the reinforcing phases are left intact as ligaments at the crack interface. Key to attaining effective toughening is the existence of suitably weak interfaces to allow debonding between the solder and the reinforcing metal structures, and energy dissipation within the ensuing bridges at separation. Even without optimizing the shielding processes, large increases in peak stress and strain to failure have been observed, with the crack resistance energy per unit area increasing up to an order of magnitude.

If a crack were able to penetrate the first castellated structure by breaking through a weak flaw, it would loose its energy in debonding due to the reinforced composite properties, and would be arrested by the next castellated structure. If no full-scale plastic zone develops about the crack tip, the shielding is predominantly associated with dissociation of plastic energy at the metal across the crack interface.

In one embodiment of the invention, the copper exposed in the contact opening of a multi-level polymer substrate in CSP is converted into a series of grooves and walls of equal height, preferably formed by a stamping technique. Such metal walls extend across the contact pad, enlarging the surface for anchoring the solder and representing a series of hurdles for a nascent crack. Such stress-initiated cracks typically originate in the joint area and are driven to propagate across the contact area. At least one wall structure is able to arrest further propagation by changing the failure mechanism from a probabilistic weakest-link mode to a parallel-type mode.

In another embodiment of the invention, the copper exposed in the contact opening of a multi-layer polymer substrate in CSP is converted into a series of grooves and walls of unequal height, preferably formed by an etching technique. The highest wall is in the center of the pad.

In another embodiment of the invention, the grooves formed by castellation or corrugation are suitable for venting air during the reflow process by which the interconnection is created. The enclosure of air bubbles during the solder distribution process is thus prevented.

It is an aspect of the invention to provide design and process concepts which are flexible so that they can be applied to many families of semiconductor products, and are general so that they can be applied to several generations of products.

Another aspect of the invention is to use only designs and processes most commonly employed and accepted in the fabrication of IC devices, thus avoiding the cost of new capital investment and using the installed fabrication equipment base.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIGS. 2 to 7 are examples of the first embodiment of the invention, FIGS. 8 and 9 are examples of the second embodiment of the invention.

FIG. 3 is a schematic cross section of a BGA substrate/solder interconnection of a second kind according to the invention.

FIGS. 4, 5, 6 and 7 are schematic top views of first interconnection metals, shaped to enlarge the contact area and to stop propagating nascent cracks, according to the invention.

DETAILED DESCRIPTION OF THE PREFERRED EMBODIMENTS

The present invention is related to U.S. Pat. No. 6,365,958, issued Apr. 2, 2002 (Ibnabdeljalil et al., "Sacrificial Structures for Arresting Insulator Cracks in Semiconductor Devices"). The present invention is further related to U.S. patent applications Ser. No. 10/057,138, filed Jan. 25, 2002 (Zuniga-Ortiz et al., "Flip-Chip without Bumps and Polymer for Board Assembly"), and U.S. patent application Ser. No. 10/086,117, Filed Feb. 26, 2002 (Bojkov et al., "Waferlevel Method for Direct Bumping on Copper Pads in Integrated Circuits")

Figure 1:
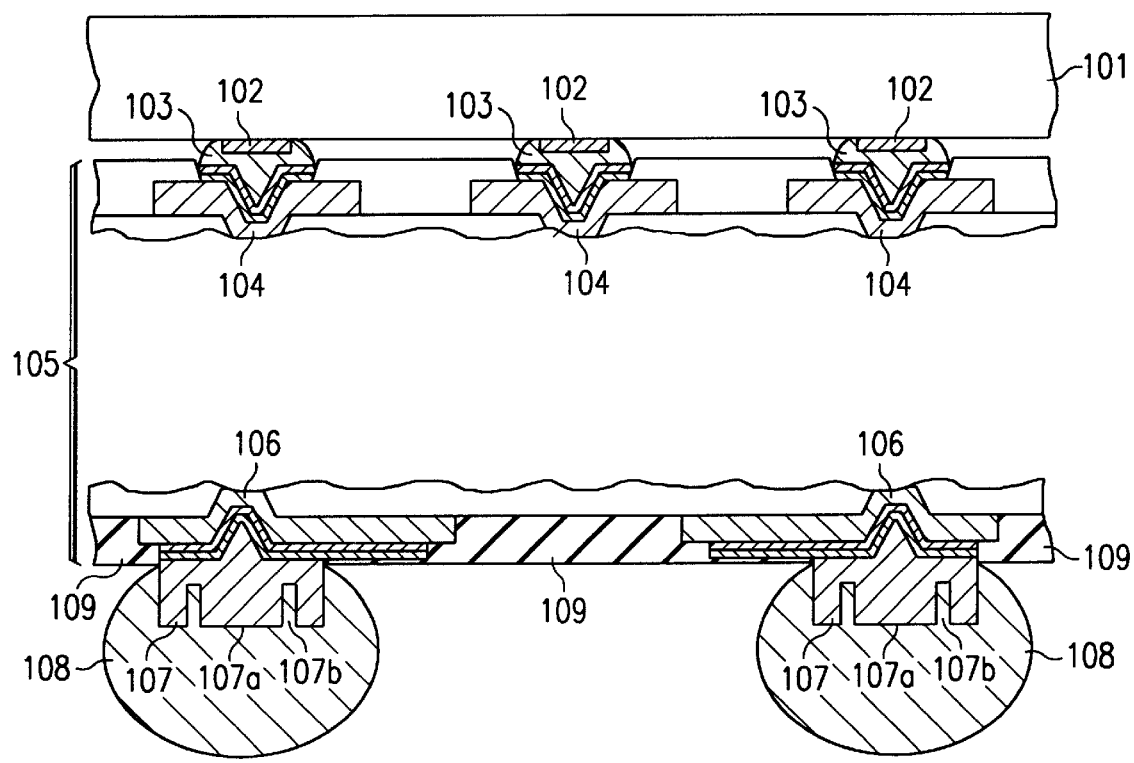
FIG. 1 illustrates a schematic cross section of an IC chip flip-assembled on a substrate prepared, according to the invention, for solder attachment to outside parts.

In order to illustrate the first embodiment of the invention, FIG. 1 is a schematic, not-to-scale cross section of a portion, generally designated 100, of a chip-scale package. Silicon chip 101 has a plurality of input/output pads with solder bumps 103 connected to corresponding pads 104 on the first surface of a multi-level metal polymer substrate 105. For assembly to outside parts, substrate 105 has, on its second surface, another plurality of I/O pads 106. The interconnections of the I/O pads 106 and the I/O pads 105 are application-dependent.

Attached to I/O pads 106 are pattern-plated copper pads 107 (thickness preferably 10 to 30 $\mu$m), protected by a thin film of organic solderability protectant (OSP, typically, benzoamidozole or benzotriazole; specifically 1% sodium M-nitrobenzene-sulfonate and 1% benzotriazole with 90% water and 8% methanol). These films burn off at the reflow or attachment temperature of the interconnection material 108, typically solder. Finally, solder balls 108 are directly attached by reflow process to copper pads 107.

It should be mentioned that preferred "solder" materials include tin, indium, tin alloys such as tin/indium, tin/silver, tin/bismuth, tin/lead, three-phase alloys, further conductive adhesives and z-axis conductive materials. Preferably, these materials are applied in pre-fabricated form (for instance, "balls").

It should further be pointed out that a flash of gold, palladium, nickel/gold, or nickel/palladium may be used instead of the organic OSP film. For either embodiment gold or OSP, the contact area of pads 107 acquire a surface affinity to forming metallurgical contacts with the interconnection metals 108, which are capable of reflowing. The mechanical interconnection strength is created by uniform solder wetting.

According to the invention, copper pads 107 are shaped to have a structure providing two characteristics:

The contact area is enlarged, at least by a factor of 2, to provide maximum mechanical interconnection strength;

The pads are configured to stop nascent cracks, propagating inward from the outer surface of the interconnection joint into the reflowed solder.

Furthermore, in order to provide a uniform manufacturing process, the invention includes pad structures, which enable the escape of air during the solder reflow process, preventing the enclosure of air bubbles.

In the first embodiment of the invention, the original plane of the pad surface is maintained during the castellation/corrugation process.

In the second embodiment of the invention, the original plane of the pad surface is broken during the castellation/corrugation process into more than one plane.

An example of the first embodiment, a castellated/corrugated contact metal exhibiting the above listed contact characteristics, is illustrated in FIG. 1 by the shape of pad 107. The originally uniform flat surface 107a of pad 107 has been structured by the castellation process to provide a series of grooves 107b, resulting in the corrugation of pad 107. Suitable structuring techniques include mechanical stamping, or chemical or plasma etching.

More detail of the first embodiment of the invention is provided in the pad configuration examples depicted in FIGS. 2 through 7. It should be stressed that, due to the flexibility of the invention, these examples are applicable to two different but equally important product categories:

Substrates of ball-grid array (BGA) packages. The material surrounding the metal pads is the so-called solder resist (an organic material mixture of acrylates and epoxies, commercially available, for example, under the product names Taiyo PSR 4000, Probimer 71, Ciba 77, or Enthone).

Integrated circuit chips. The material surrounding the metal pads is the protective overcoat layer (usually silicon nitride or silicon oxynltride) on the surface of the IC chip.

Figure 2A:
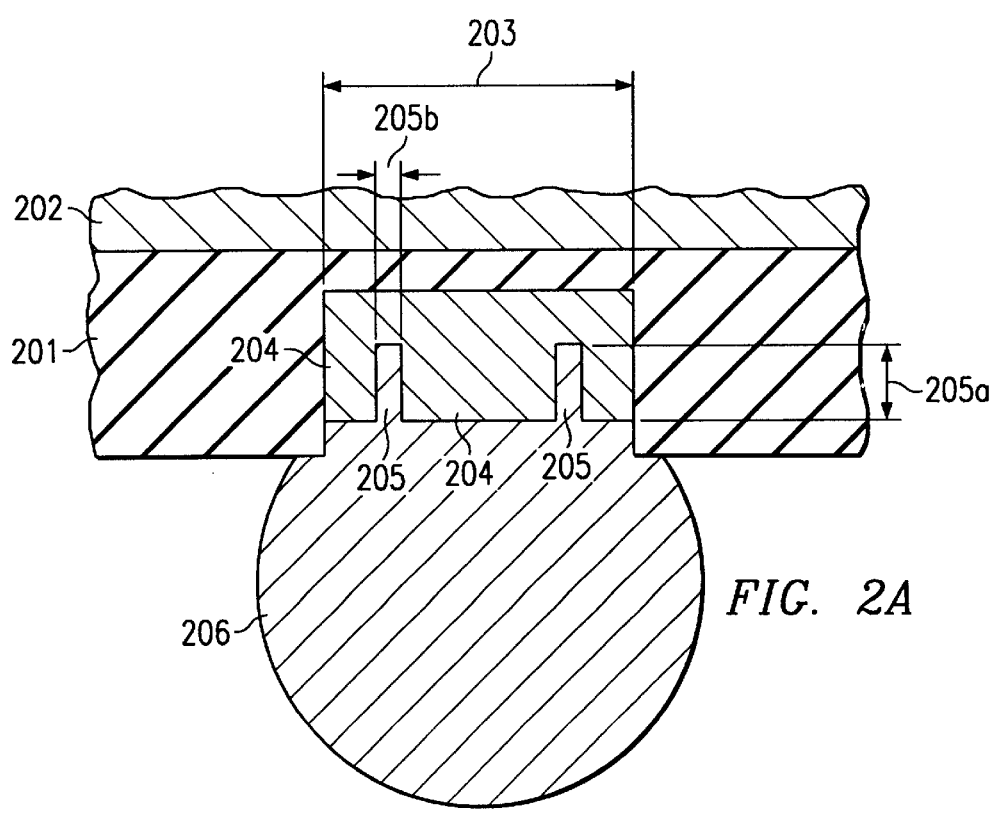
FIG. 2A is a schematic cross section of a BGA substrate/solder interconnection of a first kind according to the invention.
Figure 2B:
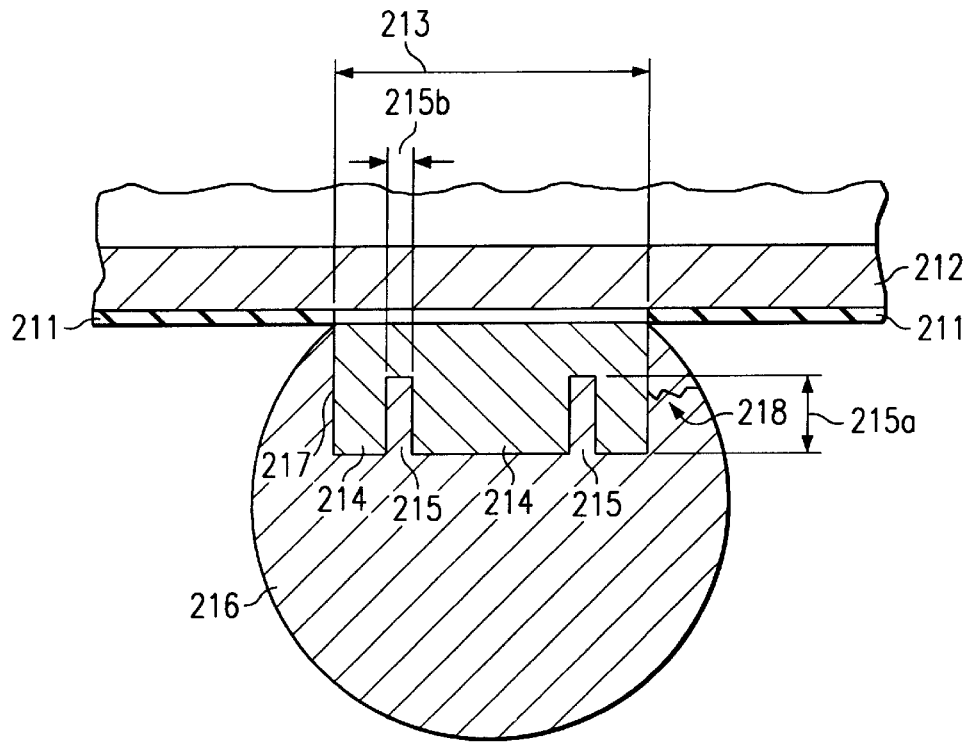
FIG. 2B is a schematic cross section of an IC chip/solder interconnection according to the invention.

FIG. 2A refers to a BGA substrate, FIG. 2B to an IC chip. In the example of FIG. 2A (schematic, not to scale), the solder mask 201 is positioned over a metal line (typically copper) 202. A window 203 (typically 100 to 700 $\mu$m wide) in the solder mask contains the attachment pad 204. Pad 204 (preferred thickness between 10 and 30 $\mu$m) fills the complete width of window 203, and has a castellated contour, increasing the surface area for solder interlocking by at least a factor of 2 compared to the area of flat geometry. The groove 205 of the castellation may have a depth 205a between 5 and 30 $\mu$m and a width 205b between 15 and 200 $\mu$m. A solder "ball" 206 is attached to metal pad 204, filling the grooves without any bubble. The "ball" diameter is typically in the range from 120 to 1000 $\mu$m. As defined herein, the term "solder ball" does not imply that the solder contacts are necessarily spherical. They may have various forms, such as semispherical, half-dome, truncated cone, or generally bump. The exact shape is a function of the deposition technique (such as evaporation, plating, or pre-fabricated units) and the reflow technique (such as infrared or radiant heat) and the material composition.

In the example of FIG. 2B (schematic, not to scale), the protective overcoat layer 211 is positioned over a metal line (typically copper) 212. Overcoat layer 212 is commonly moisture-impermeable silicon nitride or silicon oxynitride in the thickness range 0.8 to 1.5 $\mu$m. In some devices, polyimide is chosen as overcoat material in the thickness range from 5 to 20 $\mu$m. A window 213 (typically 45 to 100 $\mu$m wide) in the overcoat layer contains the attachment pad 214 (thickness preferably 0.8 to 5 $\mu$m). Pad 214 fills the complete width of window 213, and has a castellated contour, increasing the surface area at least 25% (compared to the area of flat geometry) for solder interlocking. The groove 215 of the castellation may have a depth 215a between 15 and 30 $\mu$m and a width 215b between 15 and 40 $\mu$m. A solder "ball" 216 is attached to metal pad 214, filling the grooves without any bubble. The "ball" diameter is typically in the range from 60 to 120 $\mu$m.

Figure 3:
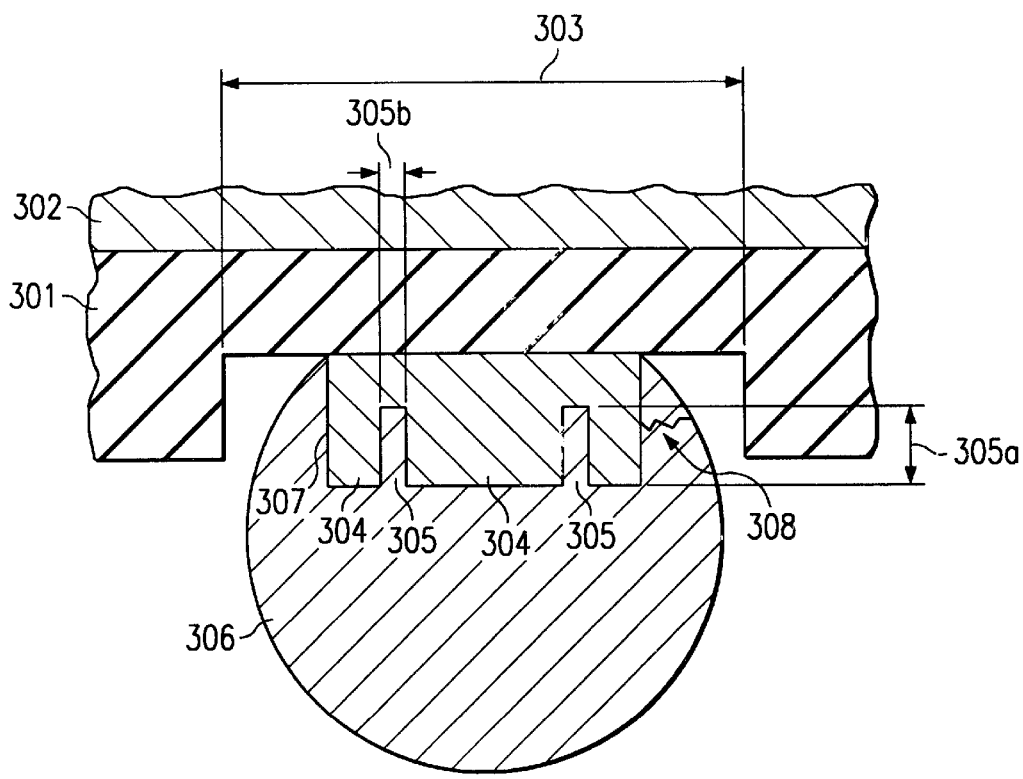

The embodiments of the invention shown in FIG. 2A for the substrate in BGA packages and in FIG. 2B for IC chips can be modified so that the corrugated metal attachment pad fills only a portion of the attachment window. FIG. 3 illustrates this modification for the case of BGA packages, in analogy to FIG. 2A. The solder mask 301 is positioned over a metal line (typically copper) 302. A window 303 (typically 100 to 700 $\mu$m wide) in the solder mask contains the attachment pad 304. Pad 304 fills the width of window 303 only partially, and has a castellated contour, increasing the surface area for solder interlocking. The groove 305 of the castellation may have a depth 305a between 5 and 30 $\mu$m and a width 305b between 15 and 200 μm. A solder "ball" 306 is attached to metal pad 304, filling the grooves without any bubble. The "ball" diameter is typically in the range from 120 to 1000 μm.

The technical advantage of the modification shown in FIG. 3 over the structure in FIG. 2A is that the solder 306 can also adhere to the side walls 307 of metal attachment pad 304, enhancing the strength of the solder interlocking. Furthermore, cracks 308, which most commonly originate at the outer solder surface close to the solder joint (where thermomechanical stress concentration is highest), are stopped by the metal of attachment pad 304. Reliability tests have shown that this crack-stopping capability of metal attachment pad 304 is a very effective mechanism to extend the lifetime of solder joints. Similar reliability improvements have been observed in the analogous case of IC chips as illustrated in FIG. 2B where nascent cracks 218 are stopped at the sidewall 217 of metal attachment pad 214.

Figure 4:
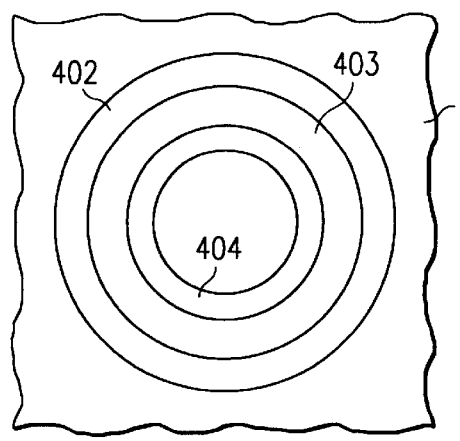

The schematic top views of FIGS. 4 to 7 depict a few examples of groove variations in metal attachment pads. Suitable techniques to fabricate these groove structures include mechanical stamping, or chemical or plasma etching. FIG. 4 represents the example, which is displayed by the cross section of FIG. 3, yet without the solder ball. The solder mask 401 has a window 402. In the center of window 402 is the metal attachment pad 403. Pad 403 has a concentric groove 404, indicated in FIG. 4 by shading.

Figure 5:
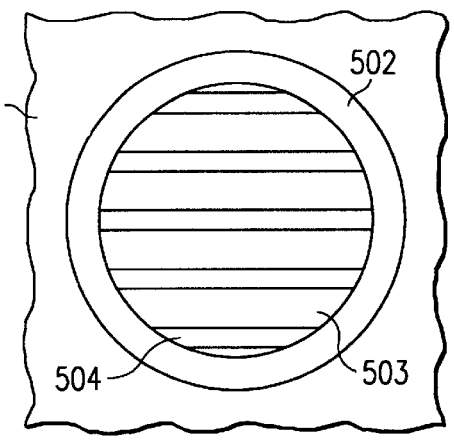

In FIG. 5, the solder mask 501 has a window 502. In the center of window 502 is the metal attachment pad 503. Pad 503 has a plurality of line-shaped grooves 504, which are arranged parallel to each other.

Figure 6:
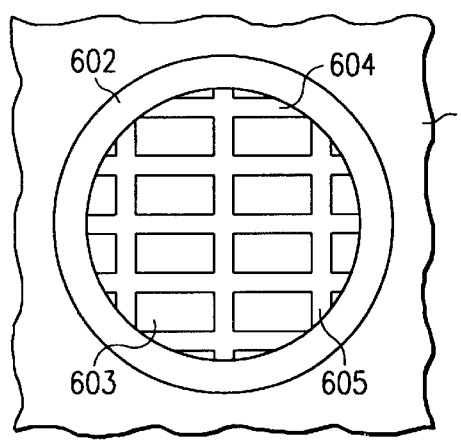

In FIG. 6, the solder mask 601 has a window 602. In the center of window 602 is the metal attachment pad 603. Pad 603 has two groups of parallel line-shaped grooves 504 and 505. The grooves intersect each other at right angles, forming numerous rectangular "islands" of metal. A pattern of grooves as illustrated in FIG. 6 results in a maximum number of metal sidewalls, which are exposed and available to solder attachment. Consequently, the strength of a solder ball, which is attached to such metal pattern, will be maximized.

Figure 7:
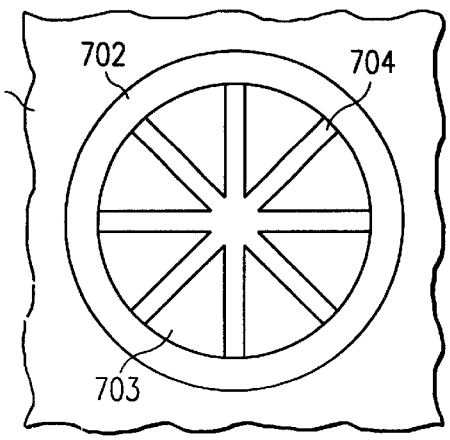

In FIG. 7, the solder mask 701 has a window 702. In the center of window 702 is the metal attachment pad 703. Pad 703 has a plurality of line-shaped grooves 704, which are arranged in a star-burst pattern and intersect each other in the center of the pad.

It should be pointed out that any groove pattern similar to the ones shown in the examples of FIGS. 5, 6 and 7, facilitates the escape of air in the solder reflow process. Consequently, an attachment pad shaped in such pattern provides air bubble-free solder joints.

Figure 8A:
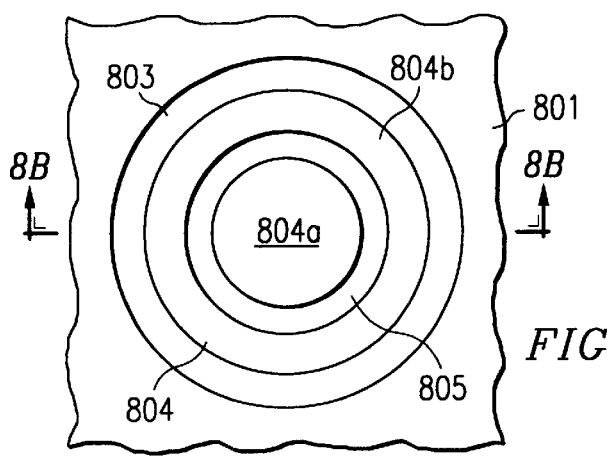
FIG. 8A is a schematic top view.
Figure 8B:
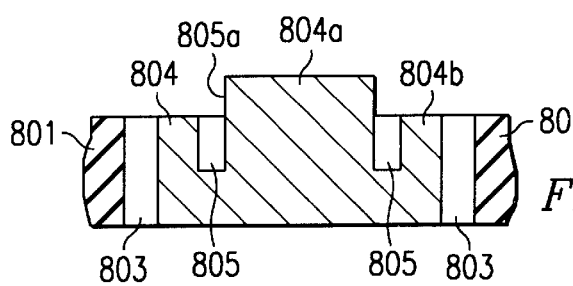
FIG. 8B is a schematic cross section of the first interconnection metal shaped in accordance with the second embodiment of the invention.

Examples of the second embodiment of the invention are depicted in FIGS. 8 and 9. FIG. 8A is a schematic top view, and FIG. 8B a schematic cross section, of a metal attachment pad 804 in the center of a window 803 in a solder mask 801 (similar to the device discussed in FIG. 3). Pad 804 has a castellated contour, characterized by groove 805. Important for the second embodiment is the unequal height of portion 804b relative to portion 804a, forming the highest wall 805a in the center of the pad. The preferred fabrication method of the pad structure in FIG. 8 is chemical or plasma etching.

After a solder ball is affixed to pad 804, the center portion 804a is especially well suited to stop any nascent crack propagating from the solder surface inward (see FIG. 3). Even a crack able to bypass the first castellation 804b would be arrested by the center corrugated structure 804a. Another technical advantage of the pad structure in FIG. 8 is the excellent air ventilation during the solder attachment/reflow process.

Figure 9A:
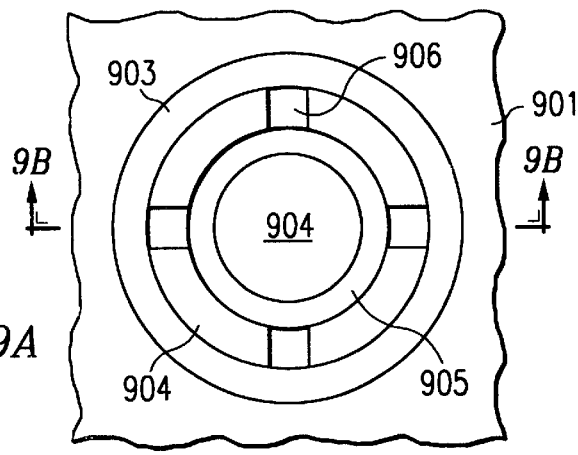
FIG. 9A is a schematic top view.
Figure 9B:
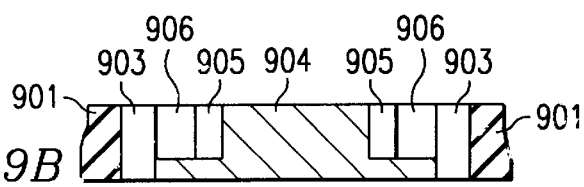
FIG. 9B is a schematic cross section of another example of the first interconnection metal shaped in accordance with the second embodiment of the invention.

FIG. 9A is a schematic top view, and FIG. 9B a schematic cross section, of a metal attachment pad 904 in the center of a window 903 in a solder mask 901 (similar to the device discussed in FIG. 3). Pad 904 has a castellated contour, characterized by groove 905. Furthermore, a plurality of openings 906 is provided to vent any air or gases to the outside in the process of reflowing solder or attaching the device to outside parts. The preferred fabrication method of the pad structure in FIG. 9 is chemical or plasma etching.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A metallurgical interconnection for electronic devices, comprising:
    a first interconnection metal having contact area and surface affinity to forming metallurgical contacts; and
    a second interconnection metal capable of reflowing;
    wherein said first metal is shaped to maximize said contact area, consequently to increase the interconnection strength, and to stop nascent cracks propagating in said interconnection.

2. The interconnection according to claim 1 wherein said first metal shape comprises castellations and corrugations.

3. The interconnection according to claim 2 wherein said castellation and corrugation is created by stamping or etching.

4. The interconnection according to claim 1 further comprising predetermined contours of said first metal, which are arranged in concentric, parallel, or repetitive patterns.

5. The interconnection according to claim 2 wherein said castellation and corrugation are creating grooves suitable for venting air during the reflow process by which said interconnection is created.

6. The interconnection according to claim 1 wherein said first metal shape comprises protrusions creating wall-like obstacles in the interconnection zones of highest thermomechanical stress, whereby propagating cracks are stopped.

7. The interconnection according to claim 1 wherein said first interconnection metal is a copper layer having a thickness between 10 and 30 μm.

8. The interconnection according to claim 6 wherein said contact area is enlarged at least by a factor of two compared to the area of flat surface geometry.

9. The interconnection according to claim 1 wherein said first interconnection metal is a copper layer having a thickness between 0.8 and 5 μm.

10. The interconnection according to claim 9 wherein said contact area is enlarged at least 25% compared to the area of flat surface geometry.

11. The interconnection according to claim 1 wherein said surface affinity for metallurgical contacts is provided by a flash of gold, nickel/gold, or nickel/palladium.

12. The interconnection according to claim 1 wherein said second interconnection metal is selected from a group consisting of tin, tin alloys including tin/indium, tin/silver, tin/bismuth, tin/lead, three-phase alloys, conductive adhesives, and z-axis conductive materials.

13. The interconnection according to claim 1 wherein said mechanical interconnection strength is created by uniform solder wetting.

14. The interconnection according to claim 1 wherein said nascent cracks are cracks in the second interconnection metal after reflow, originating at the surface and propagating deeper into and across said reflowed metal.

* * * * *